United States Patent
Huangfu et al.

(10) Patent No.: US 11,088,709 B2
(45) Date of Patent: Aug. 10, 2021

(54) POLAR CODE ENCODING METHOD AND APPARATUS

(71) Applicant: HUAWEI TECHNOLOGIES CO., LTD., Guangdong (CN)

(72) Inventors: Yourui Huangfu, Hangzhou (CN); Gongzheng Zhang, Hangzhou (CN); Chaolong Zhang, Hangzhou (CN); Rong Li, Hangzhou (CN); Jun Wang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 82 days.

(21) Appl. No.: 16/569,301

(22) Filed: Sep. 12, 2019

(65) Prior Publication Data

US 2020/0007163 A1 Jan. 2, 2020

Related U.S. Application Data

(63) Continuation of application No. PCT/CN2018/078743, filed on Mar. 12, 2018.

(30) Foreign Application Priority Data

Mar. 14, 2017 (CN) .......................... 201710150443.2

(51) Int. Cl.
*H03M 13/00* (2006.01)
*H03M 13/13* (2006.01)
(Continued)

(52) U.S. Cl.
CPC ........... *H03M 13/13* (2013.01); *H03M 13/09* (2013.01); *H03M 13/3944* (2013.01);
(Continued)

(58) Field of Classification Search
CPC .. H03M 13/13; H03M 13/09; H03M 13/3944; H04L 1/0061; H04L 69/324
See application file for complete search history.

(56) References Cited

U.S. PATENT DOCUMENTS 6,105,158 A * 8/2000 Chen ..................... H03M 13/09
714/755
6,507,927 B1 * 1/2003 Kalliojarvi ........ H03M 13/4138
714/795

(Continued)

FOREIGN PATENT DOCUMENTS

CN 103209057 A 7/2013
CN 103516476 A 1/2014
(Continued)

OTHER PUBLICATIONS

QUALCOMM Incorporated: "Polar code information bit allocation and nested extension construction",3GPP DRAFT; R1-1701187, Jan. 17, 2017, total 14 pages.
(Continued)

*Primary Examiner* — Esaw T Abraham
(74) *Attorney, Agent, or Firm* — Womble Bond Dickinson (US) LLP

(57) ABSTRACT

A polar code encoding method and apparatus are provided. The method includes: obtaining a basic sequence, where the basic sequence is a sequence obtained by sorting sequence numbers of polarized channels in descending order or ascending order of reliability, and a length of the basic sequence is $L_1$; determining, based on a maximum encoding length $L_2$ supported by a receiving device, a quantity M of segments of an information bit sequence whose length is N after encoding, where a quantity of bits in the information bit sequence before the encoding is K; and performing polar code encoding on the M segments based on the basic sequence. According to the polar code encoding method, (Continued)

during polar code construction, an encoding device needs to know only a reliability order of $\min(N/M, L_1)$ polarized channels. In this way, storage overheads of a nested sequence can be effectively reduced, and online computing complexity can be reduced.

20 Claims, 6 Drawing Sheets

(51) Int. Cl.
*H03M 13/09* (2006.01)
*H03M 13/39* (2006.01)
*H04L 1/00* (2006.01)
*H04L 29/08* (2006.01)

(52) U.S. Cl.
CPC .......... *H04L 1/0061* (2013.01); *H04L 69/324* (2013.01); *H04L 1/0066* (2013.01)

(56) References Cited

U.S. PATENT DOCUMENTS

| | | | | |
|---|---|---|---|---|
| 8,347,186 | B1* | 1/2013 | Arikan | H03M 13/1148 714/774 |
| 2011/0044399 | A1* | 2/2011 | Dowling | H04L 27/3433 375/286 |
| 2013/0163988 | A1* | 6/2013 | Krongold | H04J 14/06 398/65 |
| 2014/0016571 | A1* | 1/2014 | Yucek | H04L 1/06 370/329 |
| 2015/0026543 | A1* | 1/2015 | Li | H03M 13/45 714/776 |
| 2015/0103947 | A1 | 4/2015 | Shen et al. | |
| 2015/0194987 | A1 | 7/2015 | Li et al. | |
| 2015/0333769 | A1* | 11/2015 | Jeong | H03M 13/271 714/790 |
| 2016/0013810 | A1* | 1/2016 | Gross | H03M 13/13 714/776 |

FOREIGN PATENT DOCUMENTS

| | | |
|---|---|---|
| CN | 103684477 A | 3/2014 |
| CN | 104918063 A | 9/2015 |
| EP | 2922227 A1 | 9/2015 |
| EP | 3113387 A1 | 1/2017 |
| EP | 2637335 B1 | 1/2018 |

OTHER PUBLICATIONS

Ericsson Intel Interdigital LG ATandT: "WF on Mother Code Size of Polar Codes",3GPP DRAFT; R1-1703616, Feb. 17, 2017,total 4 pages.
Huawei et al: "Construction schemes for polar codes",3GPP DRAFT; R1-1701702, Feb. 12, 2017,total 8 pages.
Zhou Huayi et al: "Segmented CRC-Aided SC List Polar Decoding", May 15, 2016,total 6 pages.
3GPP TSG RAN WG1 Meeting #88,R1-1702713:"Tradeoffs in Polar coding for control channels",Intel Corporation, Athens, Greece, Feb. 13-17, 2017 ,total 6 pages.

* cited by examiner

POLAR CODE ENCODING METHOD AND APPARATUS

CROSS-REFERENCE TO RELATED APPLICATIONS

This application is a continuation of International Application No. PCT/CN2018/078743, filed on Mar. 12, 2018, which claims priority to Chinese Patent Application No. 201710150443.2, filed on Mar. 14, 2017. The disclosures of the aforementioned patent applications are hereby incorporated by reference in their entireties.

TECHNICAL FIELD

Embodiments of the present invention relate to the communications field, and more specifically, to a polar code encoding method and apparatus.

BACKGROUND

A polar (Polar) code is a high-performance channel encoding scheme proposed in recent years. The polar code is characterized by high performance, relatively low complexity, and flexible rate matching. Currently, the polar code has become an encoding scheme of control information in 3rd generation partnership project (3rd Generation Partnership Project, 3GPP) new radio (New radio, NR).

The polar code is a linear block code. A generator matrix of the polar code is $G_N$. An encoding process of the polar code is $x_1^N = u_1^N G_N$. Herein, $x_1^N$ is a mother code of the polar code and is a binary row vector, where a length of the mother code is N, and an element of $x_1^N$ is a code word of the mother code; $u_1^N = (u_1, u_2, K, u_N)$ is a binary row vector whose length is N (to be specific, a code length is N); and $G_N$ is an N×N matrix, and $G_N = B_N F_2^{\otimes(\log_2(N))}$, where the code length N is equal to 2n, n≥1, and $F_2^{\otimes(\log_2(N))}$ is defined as a Kronecker product of $\log_2^N$ matrices $F_2$.

Herein, $$F_2 = \begin{bmatrix} 1 & 0 \\ 1 & 1 \end{bmatrix}.$$

In the encoding process of the polar code, some bits in $u_1^N$ are used to carry information and are referred to as an information bit set, and an index set of these bits is denoted as A. The other bits are set to a fixed value that is agreed by a transmit end and a receive end in advance and are referred to as a fixed-bit set or a frozen-bit set (frozen bits), and an index set of the bits is represented by using a complementary set $A^c$ of A. The encoding process of the polar code is equivalent to $x_1^N = u_A G_N(A) \oplus u_{A^c} G_N(A^c)$. Herein, $G_N(A)$ is a sub-matrix, in $G_N$, obtained by using rows corresponding to indexes in the set A; $G_N(A^c)$ is a sub-matrix, in $G_N$, obtained by using rows corresponding to indexes in the set $A^c$; $u_A$ is an information bit set in $u_1^N$, and a quantity of information bits is K; and $u_A^c$ is a fixed-bit set in $u_1^N$, a quantity of fixed bits is (N−K), and the fixed bits are known bits. The fixed bits are usually set to 0, but the fixed bits may be randomly set provided that the transmit end and the receive end reach an agreement in advance.

Therefore, encoding output of the polar code may be simplified as $x_1^N = u_A G_N(A)$. Herein, $u_A$ is the information bit set $u_1^N$, and $u_A$ is a row vector with a length of K, namely, |A|=K, where |·| indicates a quantity of elements in the set, and K is a size of an information block; and $G_N(A)$ is the sub-matrix, in the matrix $G_N$, obtained by using the rows corresponding to the indexes in the set A, and $G_N(A)$ is a K×N matrix.

A process of constructing a polar code is a process of selecting a set A, and determines performance of the polar code. The process of constructing a polar code is generally as follows: determining, based on a code length N of a mother code, that N polarized channels exist in total and respectively correspond to N rows in an encoding matrix; calculating reliability of the polarized channels; and using, as elements of the set A, indexes of first K polarized channels with relatively high reliability in the polarized channels that are sorted in descending order of reliability, and using indexes corresponding to the remaining (N−K) polarized channels as elements of an index set $A^c$ of fixed bits. The set A determines locations of information bits, and the set $A^c$ determines locations of the fixed bits.

Therefore, in the process of constructing a polar code, a nested sequence of the mother code whose code length is N needs to be stored. Consequently, problems such as large storage overheads and a complex online computing process are caused.

SUMMARY

Embodiments of the present invention provide a polar code encoding method and apparatus, to effectively reduce storage overheads of a nested sequence and reduce online computing complexity.

According to a first aspect, a polar code encoding method is provided, where the method includes:

obtaining a basic sequence, where the basic sequence is a sequence obtained by sorting sequence numbers of polarized channels in descending order or ascending order of reliability, and a length of the basic sequence is $L_1$;

determining, based on the basic sequence and a maximum encoding length $L_2$ supported by a receiving device, M segments of an information bit sequence wherein the M segments of an information bit sequence comprises N bits, wherein the information bit sequence before encoding comprises K bits;

separately encoding the M segments by using a first encoding scheme, to obtain the M encoded segments; and performing polar code encoding on the M encoded segments.

In an embodiment of the present invention, when constructing a polar code, an encoding device needs to know only reliability of N/M polarized channels. In this way, storage overheads of a nested sequence can be effectively reduced, and online computing complexity can be reduced.

In one embodiment, the determining M segments of an information bit sequence includes:

determining, based on the maximum encoding length $L_2$ supported by the receiving device, a quantity M of segments of the information bit sequence whose length is N after the encoding, where the quantity of bits in the information bit sequence before the encoding is K; obtaining to-be-sent information of each of the M segments, where the to-be-sent information includes information bits and cyclic redundancy check CRC bits; and setting a value of a corresponding segment based on the basic sequence and the to-be-sent information of each segment.

In some embodiments, the obtaining to-be-sent information of the M segments of the information bit sequence includes: dividing the information bit sequence level by level in the following manner until the M segments are obtained;

determining two next-level segments of a present-level segment based on a bit rate of the present-level segment and information bits in the present-level segment, where an encoding length corresponding to the next-level segment is half of an encoding length corresponding to the present-level segment; and in the M segments, separately adding a corresponding cyclic redundancy check CRC code based on the information bits in each segment, to obtain the to-be-sent information of each of the M segments.

In an embodiment of the present invention, when performing polar construction for each segment, the encoding device adds a check frozen bit when the segment is cascaded to a CRC. This integrates a PC polar encoding scheme and a CA polar encoding scheme, thereby reducing a quantity of CRCs in each segment. In addition, an early stop function is implemented, and optimal performance and an optimal check capability are achieved.

In one embodiment, when M is less than or equal to $N/L_1$, the method further includes:

dividing the M segments level by level in the following manner until $N/L_1$ segments are obtained; and determining two next-level segments of a present-level segment based on a bit rate of the present-level segment and information bits in the present-level segment, where an encoding length corresponding to the next-level segment is half of an encoding length corresponding to the present-level segment, to set a value of a corresponding segment based on the basic sequence and the to-be-sent information of each segment.

In one embodiment, before the dividing the information bit sequence level by level, the method further includes:

obtaining a cyclic redundancy check CRC code of the information bit sequence, where a length of the CRC code is J'; and calculating a bit rate R of the information bit sequence based on an encoding length N, K, and J' that are corresponding to the information bit sequence.

More specifically, the determining two next-level segments of a present-level segment based on a bit rate of the present-level segment and information bits in the present-level segment includes:

determining a bit rate $R_{next1}$ of a first next-level segment based on the bit rate $R_{present}$ of the present-level segment and a quantity $K_{present}$ of information bits in the present-level segment; and determining a bit rate $R_{next2}$ of a second next-level segment, a quantity $K_{next1}$ of information bits in the first next-level segment, and a quantity $K_{next2}$ of information bits in the second next-level segment based on $R_{next1}$, where $K_{next1}=R_{next1}N_{present}/2$, $K_{next2}=K_{present}-K_{next1}$, and $N_{present}$ is an encoding length corresponding to the present-level segment.

In one embodiment, M is equal to $N/L_2$ and the obtaining to-be-sent information of the M segments of the information bit sequence includes:

dividing the information bit sequence level by level in the following manner until the M segments are obtained;

determining information bits in two next-level segments of a present-level segment based on information bits in the present-level segment and an interleaving table of the present-level segment, where an encoding length corresponding to the next-level segment is half of an encoding length corresponding to the present-level segment, the interleaving table of the present-level segment is a sequence obtained by sorting polarized channels of the next-level segments in descending order or ascending order of reliability, and a total quantity of polarized channels in the interleaving table of the present-level segment is equal to the encoding length corresponding to the present-level segment; and in the M segments, separately adding a corresponding cyclic redundancy check CRC code based on the information bits in each segment, to obtain the to-be-sent information of each of the M segments.

In one embodiment, when M is less than or equal to $N/L_1$, the method further includes:

dividing the M segments level by level in the following manner until $N/L_1$ segments are obtained; and determining information bits in two next-level segments of a present-level segment based on information bits in the present-level segment and an interleaving table of the present-level segment to the next-level segments, where an encoding length corresponding to the next-level segment is half of an encoding length corresponding to the present-level segment, the interleaving table of the present-level segment is a sequence obtained by sorting polarized channels of the next-level segments in descending order or ascending order of reliability, and a total quantity of polarized channels in the interleaving table of the present-level segment is equal to the encoding length corresponding to the present-level segment, to set a value of a corresponding segment based on the basic sequence and the to-be-sent information of each segment.

Specifically, the determining information bits in two next-level segments of a present-level segment based on information bits in the present-level segment and an interleaving table of the present-level segment to the next-level segments includes:

alternately allocating the information bit sequence to the two next-level segments of the present-level segment in descending order of reliability based on a sequence value in the present-level interleaving table.

In one embodiment, the performing polar code encoding on the M segments based on the basic sequence includes:

sequentially selecting locations of the polarized channels in the basic sequence in descending order based on a quantity of pieces of to-be-sent information of each of the M segments, to dispose the to-be-sent information; and adding a frozen bit and a check frozen bit to each of the M segments.

In one embodiment, the obtaining a basic sequence includes:

obtaining reliability of the plurality of polarized channels; and sorting the sequence numbers of the plurality of polarized channels in ascending order or descending order of reliability, to generate the basic sequence.

In one embodiment, the first coding scheme includes at least one of the following encoding schemes:

a polar code, a low density parity check LDPC code, a tail biting convolutional code TBCC, and a parallel concatenated convolutional Turbo code.

In one embodiment, when the first encoding scheme is the polar code encoding scheme, N is 2 raised to the power of a positive integer; or when the first encoding scheme is not the polar code encoding scheme, N is a positive integer.

According to a second aspect, a polar code encoding apparatus is provided, where the apparatus includes:

an obtaining unit, configured to obtain a basic sequence, where the basic sequence is a sequence obtained by sorting sequence numbers of polarized channels in descending order or ascending order of reliability, and a length of the basic sequence is $L_1$; and a processing unit, where the processing unit is configured to:

determine, based on the basic sequence and a maximum encoding length $L_2$ supported by a receiving device, M segments of an information bit sequence wherein the M segments of an information bit sequence comprises N bits, wherein the information bit sequence before encoding comprises K bits;

separately encode the M segments by using a first encoding scheme, to obtain the M encoded segments; and perform polar code encoding on the M encoded segments.

According to a third aspect, an entity apparatus is provided, where the entity apparatus includes:

a transceiver, configured to obtain a basic sequence, where the basic sequence is a sequence obtained by sorting sequence numbers of polarized channels in descending order or ascending order of reliability, and a length of the basic sequence is $L_1$; and a processor, where the processor is configured to:

determine, based on a maximum encoding length $L_2$ supported by a receiving device, M segments of an information bit sequence wherein the M segments of an information bit sequence comprises N bits, wherein the information bit sequence before encoding comprises K bits;

separately encode the M segments based on the basic sequence by using a first encoding scheme, to obtain the M encoded segments; and perform polar code encoding on the M encoded segments.

According to a fourth aspect, a computer-readable storage medium is provided. The computer-readable storage medium stores a program, and the program enables a network device to perform the method according to any one of the first aspect or the possible implementations of the first aspect.

According to a fifth aspect, a computer program product including an instruction is provided. When the product runs on a computer, the computer performs the methods described in the foregoing aspects.

DESCRIPTION OF EMBODIMENTS

The following describes technical solutions in the embodiments of the present invention with reference to the accompanying drawings.

The technical solutions of the embodiments of the present invention are applicable to various communications systems, for example, a global system for mobile communications (GSM), a code division multiple access (CDMA) system, a wideband code division multiple access (WCDMA) system, a general packet radio service (GPRS), a 5G communications system, long term evolution (LTE), an LTE frequency division duplex (FDD) system, LTE time division duplex (TDD), a universal mobile telecommunications system (UMTS), and three application scenarios in a next-generation 5G mobile communications system: enhanced mobile broadband (eMBB), ultra-reliable and low-latency communications (URLLC), and massive machine-type communications (mMTC).

A network device may be a base station or a network side device having a function of a base station. For example, the network device may be a base transceiver station (BTS) in a GSM system or CDMA, or may be a NodeB (NB) in a WCDMA system, or may be an evolved NodeB (eNB or eNodeB) in an LTE system. Alternatively, the network device may be a relay station, an access point, an in-vehicle device, a wearable device, a network device in a future 5G network, and the like.

In addition, a terminal device may also be referred to as an access terminal, user equipment (UE), a subscriber unit, a subscriber station, a mobile station, a mobile console, a remote station, a remote terminal, a mobile device, a user terminal, a terminal, a wireless communications device, a user agent, or a user apparatus. The access terminal may be a cellular phone, a cordless phone, a session initiation protocol (SIP) phone, a wireless local loop (WLL) station, a personal digital linear processing device (Personal Digital Assistant, PDA), a handheld device having a wireless communication function, a computing device or another linear processing device connected to a wireless modem, an in-vehicle device, a wearable device, or the like.

To improve polar code performance, check precoding is usually performed on an information bit set before polar encoding is performed. There are two common check precoding schemes, namely, cyclic redundancy check (CRC)-cascaded polar encoding, or parity check (PC)-cascaded polar encoding.

The following briefly describes the (CRC-aided) CA polar encoding and the PC polar encoding.

Figure 1:
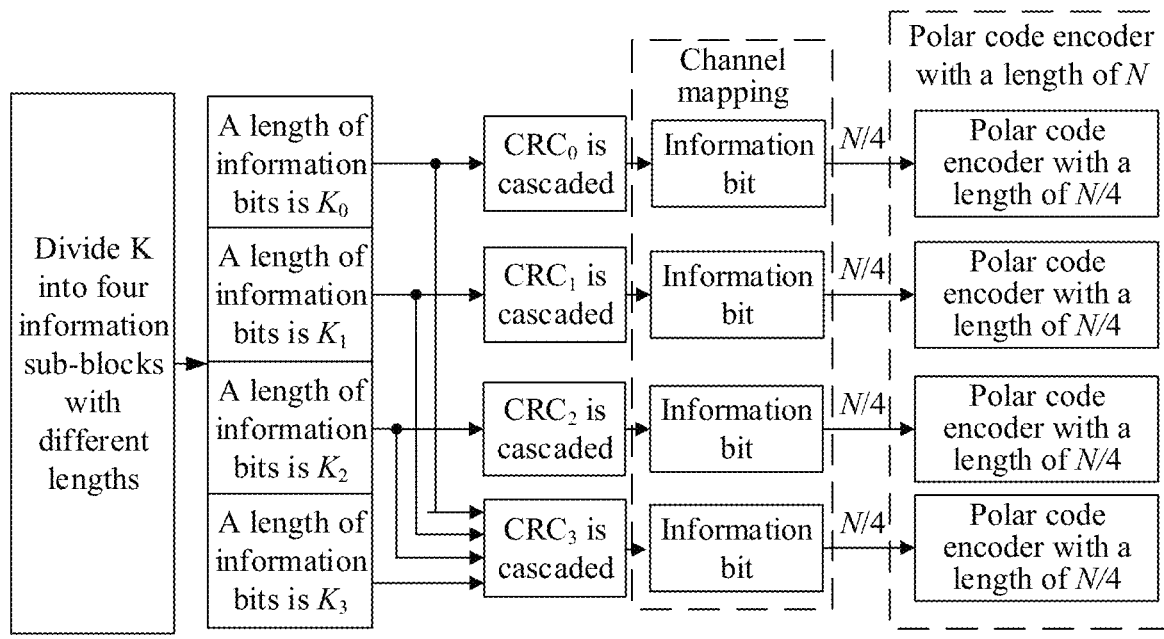
FIG. 1 is a schematic diagram of a construction of a CA polar code according to an embodiment of the present invention.

FIG. 1 is a schematic flowchart of CA polar encoding.

As shown in FIG. 1, an encoding device divides K-bit (bits) information into four segments. Quantities of information bits in the segments are respectively $K_0$, $K_1$, $K_2$, and $K_3$. After a CRC is cascaded to each segment, a length of each segment after encoding is N/4, and a sum of the lengths of the four segments after the encoding is N. For the CA polar encoding, a CRC-aided successive cancellation list (CA-SCL) decoding algorithm is used. In the CA-SCL decoding algorithm, a path on which a CRC succeeds is selected, as decoding output, from candidate paths of SCL decoding output through CRC checks.

In a CA polar encoding process, a value of the CRC is obtained by using an information bit set.

For example, it is assumed that N/4 in FIG. 1 includes {u1, u2, u3, u4, u5, u6, u7, u8}, {u1, u2} is set to a fixed-bit set, {u3, u4, u5, u6} is set to an information bit set, and {u7, u8} is a CRC bit set. Values of {u7, u8} are obtained by performing a CRC on {u3, u4, u5, u6}.

Figure 2:
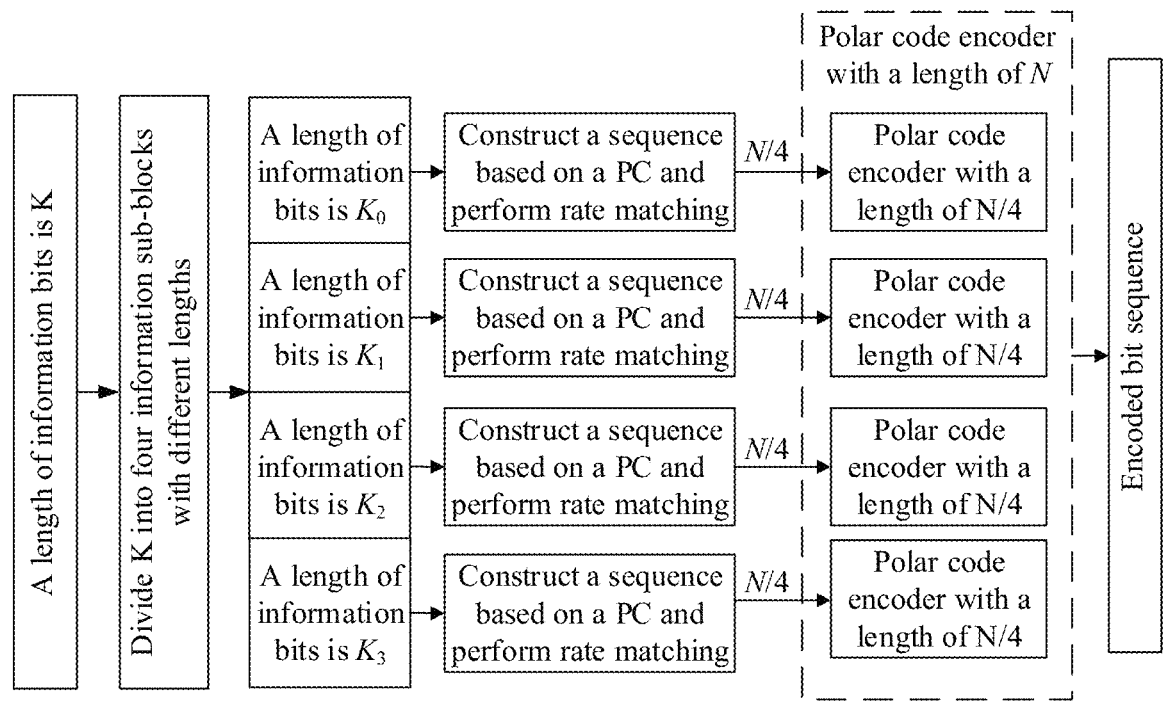
FIG. 2 is a schematic diagram of a construction of a PC polar code according to an embodiment of the present invention.

FIG. 2 is a schematic flowchart of PC polar encoding.

As shown in FIG. 2, an encoding device divides K-bit (bits) information into four segments. Quantities of information bits in the segments are respectively $K_0$, $K_1$, $K_2$, and $K_3$. A sequence is constructed based on a PC and rate matching is performed. A length of each segment after encoding is N/4, and a sum of the lengths of the four segments after the encoding is N. For the PC polar encoding, in a decoding algorithm, processes of sorting and pruning are completed in a decoding process based on an SCL decoding algorithm by using a PC fixed-bit set, to finally output a most reliable path.

For example, it is assumed that N/4 in FIG. 2 includes {u1, u2, u3, u4, u5, u6, u7}, {u1, u2, u5} is set to a fixed-bit set, {u3, u4, u6, u7} is set to an information bit set, and {u7} is a PC fixed-bit set. A value of {u7} is obtained by performing an exclusive OR operation on {u3, u6}.

In the foregoing two encoding schemes, division processing is performed in a process of first performing check precoding on an information bit set. However, during polar encoding, a nested sequence of a sequence with a length of N still needs to be stored.

In addition, a quantity of CRCs corresponding to separate CA-polar segments affects performance, and a check capability is limited if the quantity of CRCs is limited. Polar code construction needs to be performed on the complete sequence with a length of N for a separate PC-polar segment, which lacks an early stop function, and construction performance and a check capability need to be improved.

In one embodiment, a concept of a basic sequence is introduced. Transmitted information bits are divided, and polar code construction is performed on the divided information bits. In this way, storage overheads of a nested sequence can be effectively reduced, and online computing complexity can be reduced.

In one embodiment, when a decoder performs decoding, decoding paths are continuously expanded, and the decoder reserves survivor paths, for example, eight survivor paths. For PC polar encoding, the eight survivor paths are sorted based on path metric values, and the decoder finally outputs a path with a minimum path metric value and performs a CRC check on the path with the minimum path metric (PM) value. For CA polar encoding, the eight survivor paths are sorted based on path metric values, and the decoder outputs the eight survivor paths, and performs CRC checks in ascending order of path metric values until a CRC check on a survivor path succeeds. If the CRC checks on the eight survivor paths all fail, the decoder returns a survivor path with a minimum path metric value.

It should be noted that a quantity of encoded sequences may be 4 or 8 provided that a quantity of encoded subsequences does not exceed a width limit of the decoder.

Figure 3:
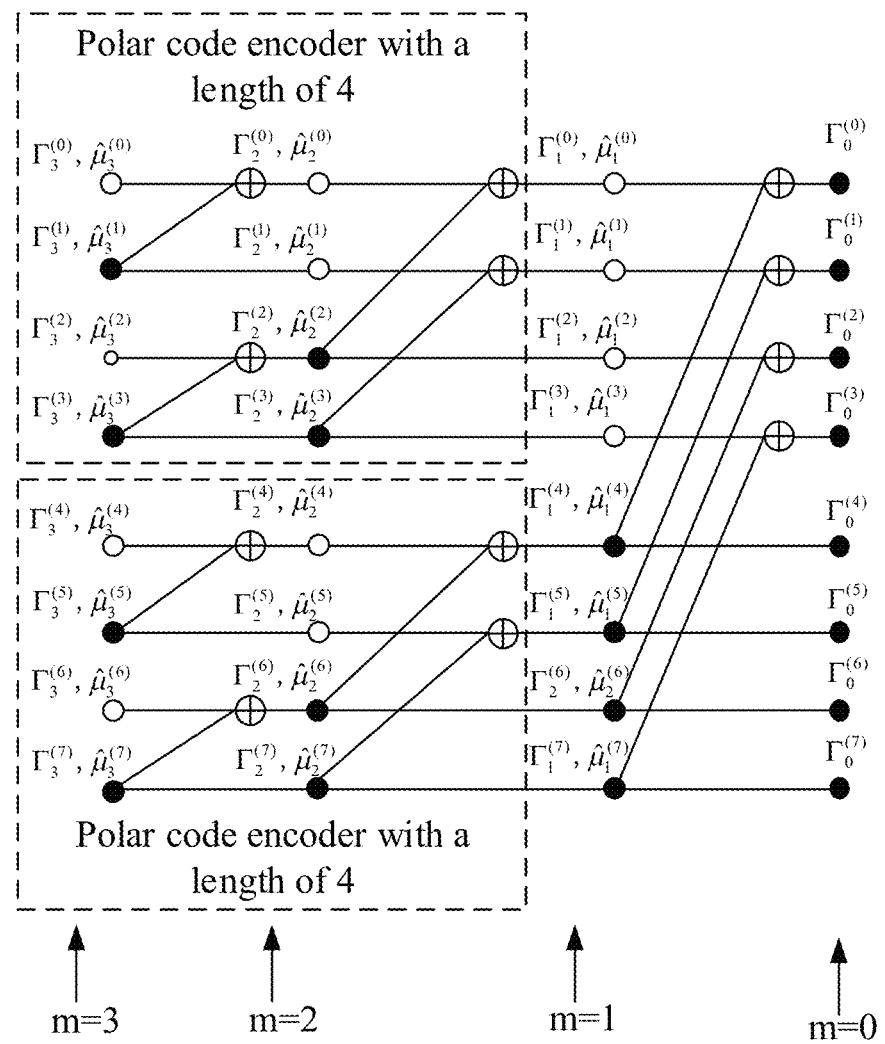
FIG. 3 is a schematic diagram of polar code division according to an embodiment of the present invention.
Figure 4:
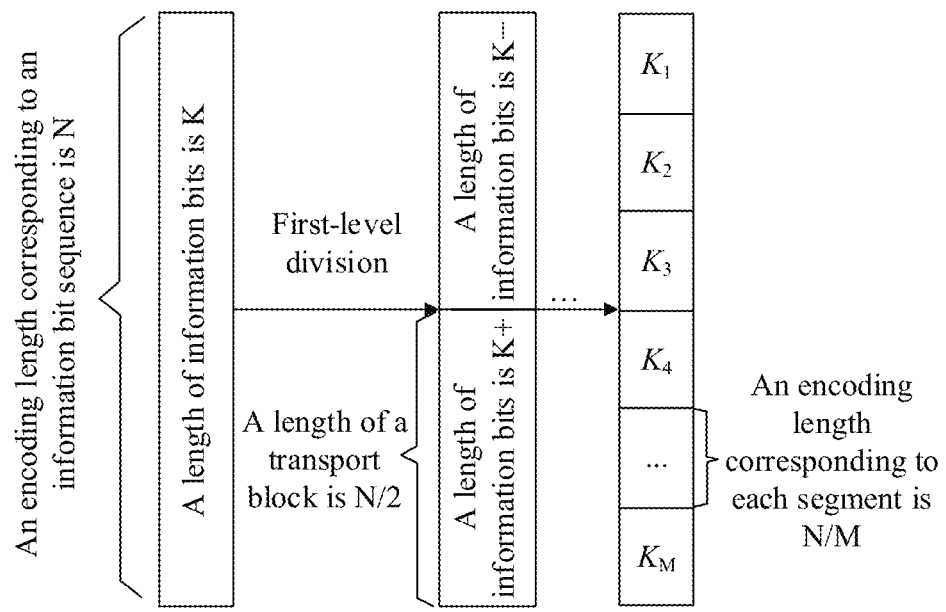
FIG. 4 is another schematic diagram of polar code division according to an embodiment of the present invention.

FIG. 3 and FIG. 4 are schematic block diagrams of information bit division according to an embodiment of the present invention.

It can be learned from features of polar encoding and decoding that a code length of an original polar code (mother code) is 2 raised to the power of an integer, and a polar code with any code length needs to be implemented through rate matching in actual application. To be specific, a polar code with a length of N may be divided into $2^m$ polar codes with a length of $N/(2^m)$, where m is a level of division.

For example, as shown in FIG. 3, for a polar code with a length of 8, when m=1, the polar code is divided into two polar codes (sub-graph of length 4) with a length of 4. By analogy, when m=2, the two polar codes with a length of 4 are divided into four polar codes with a length of 2; when m=3, the four polar codes with a length of 2 are divided into eight polar codes with a length of 1.

It should be noted that in an embodiment of the present invention, a decoding device may obtain a log likelihood ratio (LLR) sequence and perform blind detection based on the LLR sequence. Specifically, polar decoding and a CRC check are performed. If the CRC check succeeds, an information bit sequence is successfully obtained, and the blind detection process ends. If the CRC check fails, the blind detection is continuously performed.

For another example, as shown in FIG. 4, if row encoding is performed on an information bit sequence with a length of K at a time, an encoding length of the information bit sequence is N. First-level division is performed on the information bit sequence, two information bit sequences whose lengths are respectively K+ and K− are generated, and encoding lengths corresponding to the two information bit sequences are N/2. By analogy, after multi-level division, M segments may be obtained, and an encoding length corresponding to each of the M segments is N/M.

Therefore, reliability of only N/M polarized channels needs to be known during polar code construction. In this way, storage overheads of a nested sequence can be effectively reduced, and online computing complexity can be reduced.

In one embodiment, a sequence obtained by sorting sequence numbers of the N/M polarized channels in descending order or ascending order of reliability is referred to as a basic sequence. The information bit sequence is divided based on the basic sequence. The method in this embodiment of the present invention may be performed by an encoding device.

For example, the encoding device may be a mobile station, or may be an application-specific integrated circuit (Application-Specific Integrated Circuit, ASIC) or a digital signal processor (Digital Signal Processor, DSP) or a chip that implements a related function.

Figure 6:
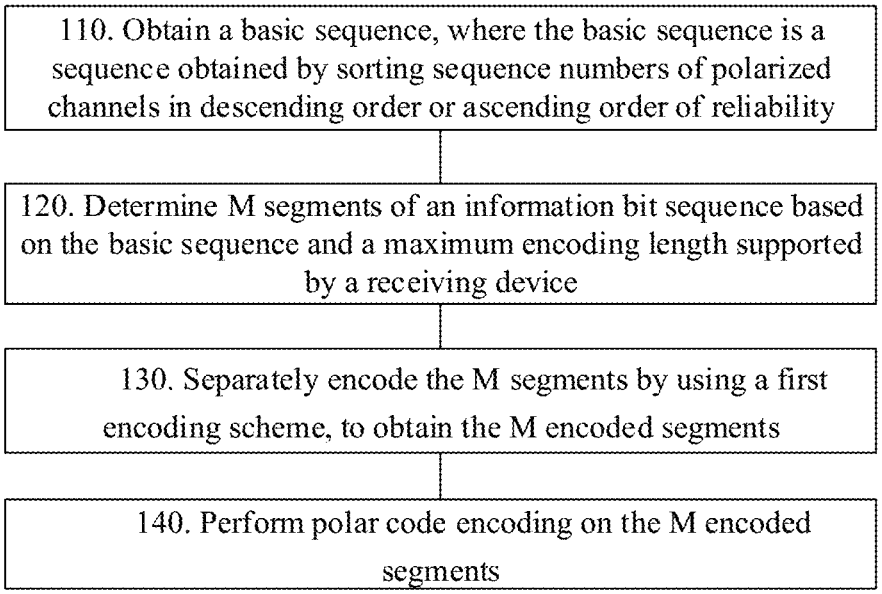
FIG. 6 is a schematic flowchart of a polar code encoding method according to an embodiment of the present invention.

Specifically, as shown in FIG. 6, the method 100 includes the following operations.

Operation 110. Obtain a basic sequence, where the basic sequence is a sequence obtained by sorting sequence numbers of polarized channels in descending order or ascending order of reliability.

Specifically, an encoding device obtains the sequence obtained by sorting the sequence numbers of the polarized channels in descending order or ascending order of reliability.

For example, the basic sequence $N_8$=[7, 6, 5, 3, 4, 2, 1, 0] represents sequence numbers of polarized channels that are sorted in descending order or ascending order of reliability. Specifically, if the basic sequence is obtained by performing sorting in descending order of reliability, $N_8$=[7, 6, 5, 3, 4, 2, 1, 0] indicates that a polarized channel 7 has highest reliability in the eight polarized channels, and reliability of polarized channels 6, 5, 3, 4, 2, 1, and 0 is in descending order. In other words, the polarized channel 0 has lowest reliability.

Figure 5:
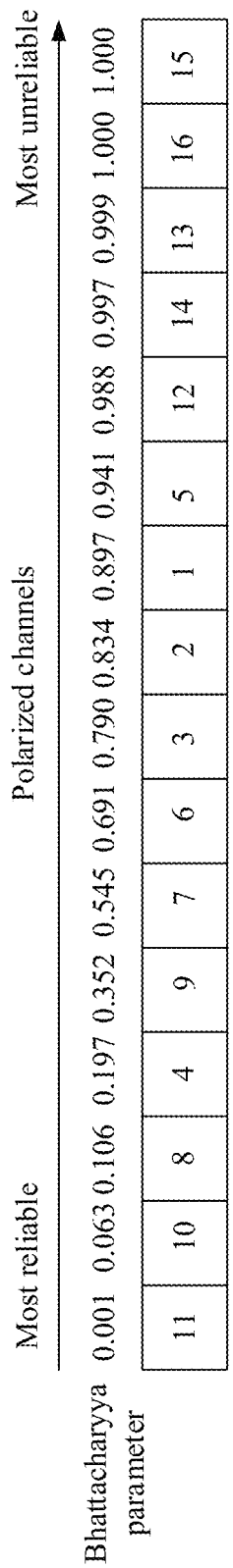
FIG. 5 is a schematic structural diagram of a basic sequence according to an embodiment of the present invention.

FIG. 5 shows 16 polarized channels. The 16 bit channels are sorted in descending order of reliability of the polarized channels.

A Bhattacharyya parameter shown in FIG. 5 is a parameter used to indicate reliability of a bit channel. For details, refer to the prior art. Details are not described herein. It should be further understood that the Bhattacharyya parameter herein is merely example description, and should not limit the protection scope of this application.

In another embodiment, the reliability of the plurality of polarized channels is obtained. The sequence numbers of the plurality of polarized channels are sorted in ascending order or descending order of reliability, to generate the basic sequence.

Operation 120. Determine, based on a maximum encoding length $L_2$ supported by a receiving device, M segments of an information bit sequence, where a quantity of bits in the information bit sequence before encoding is K.

Specifically, a quantity M of segments of the information bit sequence whose length is N after the encoding is determined based on the maximum encoding length $L_2$ supported by the receiving device, where the quantity of bits in the information bit sequence before the encoding is K; to-be-sent information of each of the M segments is obtained, where the to-be-sent information includes information bits and cyclic redundancy check CRC bits; and a value of a corresponding segment is set based on the basic sequence and the to-be-sent information of each segment.

It should be noted that the encoding device prestores a basic sequence, the sequence is obtained through sorting based on reliability, and a quantity of polarized channels is $L_1$. It is assumed that a quantity of information bits on which polar code construction needs to be performed is K, and a corresponding encoding length is N. When N is less than or equal to $L_1$, a corresponding sequence is read from the basic sequence based on values of N and K because the basic sequence is a nested (nested) sequence. The following mainly describes a case in which N is greater than $L_1$.

In one embodiment, M is a quantity of segments finally obtained after an information bit quantity is divided, and $L_2$ is the maximum encoding length supported by the receiving device. In an embodiment of the present invention, M is a positive integer greater than or equal to $N/L_2$.

For example, it is assumed that $L_1$ is 64, N is 256, and $L_2$ is 128. If division is performed based on the maximum encoding length $L_2$ supported by the receiving device, two segments are obtained, namely, M=2. If division is performed based on the length $L_1$ of the basic sequence, four segments are obtained, namely, M=4.

The following separately describes an implementation in which the encoding device determines a value of each segment when M is greater than $N/L_1$ and an implementation in which the encoding device determines a value of each segment when M is less than or equal to $N/L_1$.

In an embodiment, when M is greater than $N/L_1$, the information bit sequence may be divided level by level in the following manner until M segments are obtained.

Two next-level segments of a present-level segment are determined based on a bit rate of the present-level segment and information bits in the present-level segment, where an encoding length corresponding to the next-level segment is half of an encoding length corresponding to the present-level segment.

In the M segments, a corresponding cyclic redundancy check CRC code is separately added based on information bits in each segment, to obtain the to-be-sent information of each of the M segments.

In other words, the encoding device determines, through calculation, that a quantity of segments in the basic sequence has been implemented but a quantity of segments that is supported by the decoding device has not been implemented. In this case, no calculation is required, and division is further performed until the quantity of segments that is supported by the decoding device is reached. Then, a CRC is cascaded to information bits in each segment, to obtain a quantity of information bits in each segment to which a CRC code is added.

In a calculation process for each division, a bit rate $R_{next1}$ of a first next-level segment is determined based on a bit rate $R_{present}$ of a present-level segment and a quantity $K_{present}$ of information bits in the present-level segment; and a bit rate $R_{next2}$ of a second next-level segment, a quantity $K^{next}$ of information bits in the first next-level segment, and a quantity $K_{next2}$ of information bits in the second next-level segment are determined based on $R_{next1}$, where $K_{next1}=R_{next1}N_{present}/2$, $K_{next2}=K_{present}-K_{next1}$, and $N_{present}$ is an encoding length corresponding to the present-level segment.

In other words, it is assumed that a bit rate of a present-level segment is $R_{i,j}$, and a quantity of information bits in the present-level segment is $K_{i,j}$. An information bit sequence in each present-level segment is divided into two segments based on the bit rate $R_{i,j}$ of each present-level segment and the quantity $K_{i,j}$ of bits in the information bit sequence in each present-level segment, where quantities of information bits in the two segments are respectively $K_{i+1,1}$ and $K_{i+1,2}$. An encoding length corresponding to the next-level segment is half of an encoding length corresponding to the present-level segment. Herein, i represents a quantity of division times, and j is used to represent a quantity of segments at level i. By analogy, the division is performed until a quantity of segments reaches M or the encoding length corresponding to each next-level segment is a ratio between N and M, namely, N/M.

Specifically, $R_{next1}$ may be obtained through calculation by using a mutual information transfer formula.

For example, it is assumed that an information bit sequence with a length of $K_{01}$ is relative to an encoding length $N_0$ corresponding to the information bit sequence, and a bit rate of the information bit sequence is $R_{01}$. After level 1 division is performed on the information bit sequence, a first segment and a second segment are obtained. A bit rate $R_{11}$ of the first segment may be obtained through calculation based on $K_{01}$ and $R_{01}$, and a bit rate $R_{12}$ of the second segment, a quantity $K^{11}$ of bits in an information bit sequence in the first segment, and a quantity $K^{12}$ of bits in an information bit sequence in the second segment are determined based on $R^{11}$. Herein, encoding lengths corresponding to the first segment and the second segment are both $N_0/2$, $K_{11}=R_{01}N/2$, and $K_{12}=K_{01}-K_{11}$.

In one embodiment, before the information bit sequence is divided level by level, the method further includes:

obtaining a cyclic redundancy check CRC code of the information bit sequence, where a length of the CRC code is J'; and calculating a bit rate R of the information bit sequence based on an encoding length N, K, and J' that are corresponding to the information bit sequence.

It should be understood that, in an embodiment of the present invention, a quantity of CRC bits may vary with a value of K. For example, when $K_1=0$, and $J_1=0$, because the CRC code with a length of J' in a last segment is used for error correction, the quantity of CRC bits in the last segment may be equal to 0 or equal to log2 (a list size of the last segment). Optionally, small K corresponds to small J, and large K corresponds to large J.

In another embodiment, when M is less than or equal to $N/L_1$, after determining the M segments of the information bit sequence, the encoding device further needs to perform the following operations, to set a value of a corresponding segment based on the basic sequence and the to-be-sent information of each segment.

The M segments are divided level by level in the following manner until $N/L_1$ segments are obtained.

Two next-level segments of a present-level segment are determined based on a bit rate of the present-level segment and information bits in the present-level segment, where an encoding length corresponding to the next-level segment is half of an encoding length corresponding to the present-level segment.

In other words, the encoding device determines, through calculation, that a preset quantity M of segments has been implemented but a quantity of segments in the basic sequence has not been implemented. In this case, CRCs are separately cascaded to information bits in a plurality of segments, to obtain a quantity of information bits in each segment to which a CRC code is added. Calculation is continuously performed by using a new quantity of information bits until a quantity of segments reaches the quantity of segments in the basic sequence.

A calculation process for each division is similar to that in the foregoing embodiment. To avoid repetition, details are not described herein again.

The foregoing describes an implementation in which the encoding device determines the two next-level segments of the present-level segment based on the bit rate of the present-level segment and the information bits in the present-level segment. The following describes an implementation in which the encoding device determines the two next-level segments of the present-level segment based on the information bits in the present-level segment and an interleaving table of the present-level segment.

In an embodiment, when M is greater than $N/L_1$, operation 120 includes:

dividing the information bit sequence level by level in the following manner until the M segments are obtained;

determining information bits in two next-level segments of a present-level segment based on information bits in the present-level segment and an interleaving table of the present-level segment, where an encoding length corresponding to the next-level segment is half of an encoding length corresponding to the present-level segment, the interleaving table of the present-level segment is a sequence obtained by sorting polarized channels of the next-level segments in descending order or ascending order of reliability, and a total quantity of polarized channels in the interleaving table of the present-level segment is equal to the encoding length corresponding to the present-level segment; and in the M segments, separately adding a corresponding cyclic redundancy check CRC code based on the information bits in each segment, to obtain the to-be-sent information of each of the M segments.

In other words, the encoding device determines, through calculation, that a quantity of segments in the basic sequence has been implemented but a quantity of segments that is supported by the decoding device has not been implemented. In this case, no calculation is required, and division is further performed until the quantity of segments that is supported by the decoding device is reached. Then, a CRC is cascaded to information bits in each segment, to obtain a quantity of information bits in each segment to which a CRC code is added.

Specifically, the information bit sequence is alternately allocated to the two next-level segments of the present-level segment in descending order of reliability based on a sequence value in the present-level interleaving table.

The interleaving table in an embodiment of the present invention may be preset, or may be system information configured in the decoding device and the encoding device. The interleaving table is a sequence obtained by extending the basic sequence through interleaving and by sorting quantities of polarized channels in descending order or ascending order of reliability.

To be specific, when determining the two next-level segments of the present-level segment based on the information bits in the present-level segment and the interleaving table of the present-level segment, the encoding device not only stores the basic sequence, but also stores an interleaving table in which the length $L_1$ of the basic sequence is extended to $2*L_1$, an interleaving table in which $2*L_1$ is extended to $4*L_1$, and so on until $N_{max}$ is reached.

It is assumed that a form of the interleaving table is shown in the following Table 1:

TABLE 1

| | |
|---|---|
| N = 8→N = 16 | [4, 3, 1]→[4, 1, 3, 3, 1, 4] |
| N = 16→N = 32 | [5, 5, 1, 1, 2, 1, 1]→[5, 1, 5, 1, 1, 2, 1, 1, 2 1, 1, 5, 1, 5] |
| N = 32→N = 64 | [7, 7, 1, 2, 1, 3, 1, 2, 1, 1, 1, 1, 1, 1, 1, 1]→[ . . . ] |
| . . . | . . . |

In Table 1, a length of a basic sequence is 8, and the basic sequence is interleaved, in an inverse sequence interleaving manner by using a correspondence in a first row, to a sequence obtained by sorting quantities of polarized channels in descending order of reliability. Specifically, reliability of 16 polarized channels after extension is divided into six layers, namely, [4, 1, 3, 3, 1, 4]. Numbers in the sequence indicate quantities of polarized channels, and an order in the sequence indicates an order of reliability.

Figure 7:
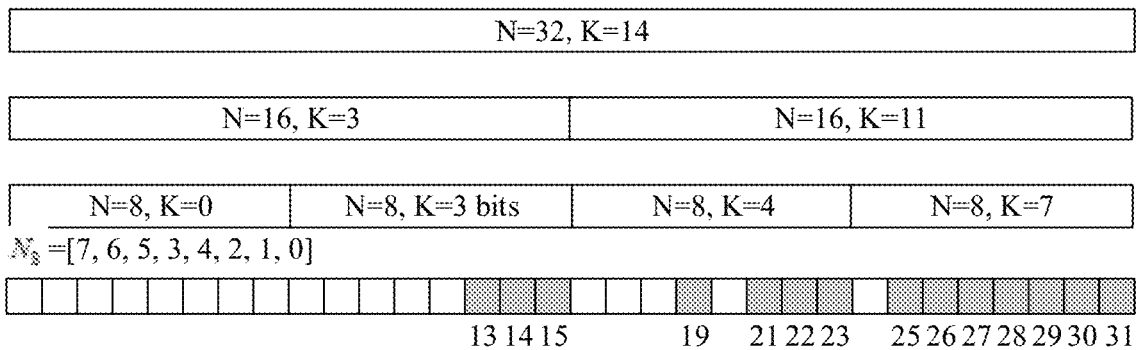
FIG. 7 is a schematic diagram of an information bit division method based on an interleaving table according to an embodiment of the present invention.

FIG. 7 is a block diagram of an example of determining two next-level segments of a present-level segment based on an interleaving table according to an embodiment of the present invention.

With reference to Table 1, as shown in FIG. 7, for an information bit sequence in which N=32 and K=14, the information bit sequence in which K=14 is divided into two segments based on [5, 1, 5, 1, 1, 2, 1, 1, 2, 1, 1, 5, 1, 5] corresponding to N=32 in Table 1, and information bits are alternately allocated to a second half of the present-level segment and a first half of a present level from left to right.

Specifically, 5-bit information is allocated to the second half of the present level, 1-bit information is allocated to the first half of the present level, 5-bit information is allocated to the second half of the present level, 1-bit information is allocated to the first half of the present level, and 1-bit information is allocated to the second half of the present level. Finally, the information bit sequence in which K=14 is divided into an 11-bit second half and a 3-bit first half.

It should be understood that Table 1 and FIG. 7 are merely example descriptions of the interleaving table and a method for dividing a present-level segment into two segments based on the interleaving table according to an embodiment of the present invention. Persons skilled in the art should aware that a specific presentation form of the interleaving table and an implementation of performing division based on the interleaving table are not limited thereto.

For example, the interleaving table may also be obtained by sorting the polarized channels in ascending order of reliability.

For another example, other implementations of allocating information bits to two segments of a present-level segment may be configured for the encoding device and a receive end.

In another embodiment, when M is less than or equal to $N/L_1$, after determining the M segments of the information bit sequence, the encoding device further needs to perform the following operations, to set a value of a corresponding segment based on the basic sequence and the to-be-sent information of each segment.

The M segments are divided level by level in the following manner until $N/L_1$ segments are obtained.

Two next-level segments of a present-level segment are determined based on an interleaving table of the present-level segment to the next-level segments and information bits in the present-level segment, where an encoding length corresponding to the next-level segment is half of an encoding length corresponding to the present-level segment, the interleaving table of the present-level segment is a sequence obtained by sorting polarized channels of the next-level segments in descending order or ascending order of reliability, and a total quantity of polarized channels in the interleaving table of the present-level segment is equal to the encoding length corresponding to the present-level segment.

In other words, the encoding device determines, through calculation, that a preset quantity M of segments has been implemented but a quantity of segments in the basic sequence has not been implemented. In this case, CRCs are separately cascaded to information bits in a plurality of segments, to obtain a quantity of information bits in each segment to which a CRC code is added. Calculation is continuously performed by using a new quantity of information bits until a quantity of segments reaches the quantity of segments in the basic sequence.

A calculation process for each division is similar to that in the foregoing embodiment. To avoid repetition, details are not described herein again.

According to the foregoing embodiments, the encoding device can determine a quantity of pieces of to-be-sent information of each of the M segments; sequentially select locations of the polarized channels in the basic sequence in descending order based on the quantity of pieces of to-be-sent information of each of the M segments, to dispose the to-be-sent information; and add a frozen bit and a check frozen bit to each of the M segments.

In other words, the encoding device sequentially selects the sequence numbers of the polarized channels in the basic sequence in descending order of reliability based on information bit of each of the M segments, adds the frozen bit and the check frozen bit to each of the M segments, and performs polar code encoding.

Generally, a terminal receives a symbol sequence. The symbol sequence is obtained after a base station performs polar code encoding on control information and performs modulation and mapping. The terminal performs demapping and demodulation on the symbol sequence to obtain an encoded sequence. Two encoded subsequences are selected from the encoded sequence. Polar decoding is performed on the two encoded subsequences, to obtain an information bit set. The information bit set includes an information bit sequence and a cyclic redundancy check CRC sequence. The CRC sequence is descrambled by using a terminal identifier, and a CRC check is performed on the information bit sequence. If the CRC check succeeds, the information bit sequence is obtained.

In other words, in an embodiment, the encoding device performs CRC encoding on the information bits in each segment based on a corresponding quantity of CRC codes, performs CRC encoding on all K information bits by using the CRC code with a length of J', and disposes the information bits to corresponding locations. A value of the frozen bit is set, and a value of the check frozen bit is set based on a check equation.

Figure 8:
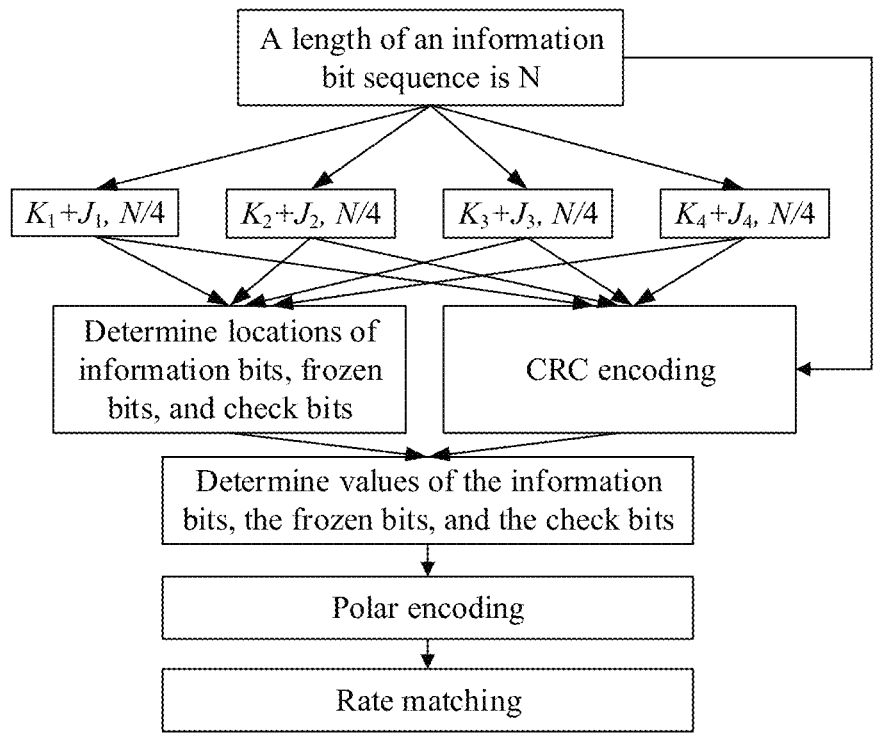
FIG. 8 is a schematic diagram of a construction of a polar code according to an embodiment of the present invention.

FIG. 8 is a schematic diagram of a construction of a polar code according to an embodiment of the present invention.

As shown in FIG. 8, it is assumed that an encoding device determines, based on a basic sequence and a maximum decoding length supported by a decoding device, to divide an information bit sequence with a length of K into four segments, and the encoding device may perform CRC encoding in a division process based on the foregoing embodiments, and finally may determine a quantity of information bits corresponding to each segment by calculating a bit rate or querying an interleaving table. Specifically, it is determined that quantities of information bits in the four segments are respectively $K_1+J_1$ and $N/4$, $K_2+J_2$ and $N/4$, $K_3+J_3$ and $N/4$, and $K_4+J_4$ and $N/4$.

Therefore, the encoding device may sequentially determine locations of information bits in the basic sequence in descending order of reliability based on $K_1+J_1$ and $N/4$, $K_2+J_2$ and $N/4$, $K_3+J_3$ and $N/4$, and $K_4+J_4$ and $N/4$.

After determining the locations of the information bits, the encoding device further determines a location and a value of a frozen bit, and determines a location and a value of a check frozen bit based on an SCL decoding algorithm by using a PC fixed-bit set. In an embodiment, when a polar construction is performed for each segment, a check frozen bit is added when a CRC is cascaded to each segment. Therefore, in an embodiment of the present invention, when polar construction is performed for each segment, a PC polar encoding scheme and a CA polar encoding scheme are integrated. A quantity of CRCs in each segment is reduced. In addition, an early stop function is implemented, and optimal performance and an optimal check capability are achieved.

Operation 130. Separately encode the M segments based on the basic sequence by using a first encoding scheme, to obtain the M encoded segments.

In an embodiment, the first encoding scheme includes at least one of the following encoding schemes:

a polar (Polar) code, a low density parity check code (LDPC), a tail biting convolutional code (TBCC), and a parallel concatenated convolutional Turbo code. For ease of description, in an embodiment of the present invention, only the polar code is used as an example for description.

Operation 140. Perform polar code encoding on the M encoded segments.

Specifically, after determining the value of each segment, the encoding device separately encodes the M segments by using the first encoding scheme, and then performs polar code encoding on the M segments that are obtained after being encoded by using the first encoding scheme.

The foregoing describes the polar encoding method in the embodiments of the present invention with reference to FIG. 1 to FIG. 8. The following describes a device in the embodiments of the present invention with reference to the accompanying drawings.

Figure 9:
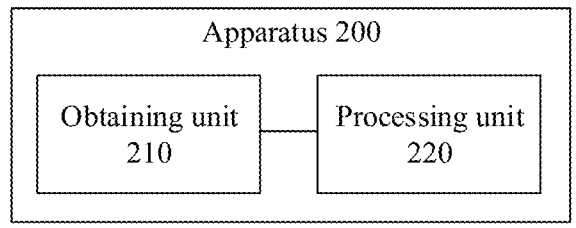
FIG. 9 is a logical structural diagram of an apparatus according to an embodiment of the present invention.

FIG. 9 is a logical structural diagram of a polar encoding and decoding apparatus 200 according to an embodiment of the present invention. For example, the apparatus 200 may be a mobile station, or may be an application-specific integrated circuit (ASIC) or a digital signal processor (DSP) or a chip that implements a related function.

As shown in FIG. 9, the apparatus 200 is described as follows according to some embodiments.

In one embodiment, the apparatus includes:

an obtaining unit 210, configured to obtain a basic sequence, where the basic sequence is a sequence obtained by sorting sequence numbers of polarized channels in descending order or ascending order of reliability, and a length of the basic sequence is $L_1$; and a processing unit 220, where the processing unit 220 is configured to:

determine, based on the basic sequence and a maximum encoding length $L_2$ supported by a receiving device, M segments of an information bit sequence whose length is N after encoding, where a quantity of bits in the information bit sequence before the encoding is K; separately encode the M segments by using a first encoding scheme, to obtain the M encoded segments; and perform polar code encoding on the M encoded segments.

In one embodiment, the processing unit 220 is specifically configured to:

determine, based on the maximum encoding length $L_2$ supported by the receiving device, a quantity M of segments of the information bit sequence whose length is N after the encoding, where the quantity of bits in the information bit sequence before the encoding is K; obtain to-be-sent information of each of the M segments, where the to-be-sent information includes information bits and cyclic redundancy check CRC bits; and set a value of a corresponding segment based on the basic sequence and the to-be-sent information of each segment.

In one embodiment, the processing unit 220 is specifically configured to:

divide the information bit sequence level by level in the following manner until the M segments are obtained;

determine two next-level segments of a present-level segment based on a bit rate of the present-level segment and information bits in the present-level segment, where an encoding length corresponding to the next-level segment is half of an encoding length corresponding to the present-level segment; and in the M segments, separately add a corresponding cyclic redundancy check CRC code based on the information bits in each segment, to obtain the to-be-sent information of the M segments.

In one embodiment, when M is less than or equal to $N/L_1$, the processing unit 220 is further configured to:

divide the M segments level by level in the following manner until $N/L_1$ segments are obtained; and determine two next-level segments of a present-level segment based on a bit rate of the present-level segment and information bits in the present-level segment, where an encoding length corresponding to the next-level segment is half of an encoding length corresponding to the present-level segment, to set a value of a corresponding segment based on the basic sequence and the to-be-sent information of each segment.

In one embodiment, before the processing unit 220 divides the information bit sequence level by level, the obtaining unit 210 is further configured to:

obtain a cyclic redundancy check CRC code of the information bit sequence, where a length of the CRC code is J'; and calculate a bit rate R of the information bit sequence based on an encoding length N, K, and J' that are corresponding to the information bit sequence.

In one embodiment, the processing unit 220 is specifically configured to:

determine a bit rate $R_{next1}$ of a first next-level segment based on the bit rate $R_{present}$ of the present-level segment and a quantity $K_{present}$ of information bits in the present-level segment; and determine a bit rate $R_{next2}$ of a second next-level segment, a quantity $K_{next1}$ of information bits in the first next-level segment, and a quantity $K_{next2}$ of information bits in the second next-level segment based on $R_{next1}$, where $K_{next1}=R_{next1}N_{present}/2$, $K_{next2}=K_{present}-K_{next1}$, and $N_{present}$ is an encoding length corresponding to the present-level segment.

In one embodiment, the processing unit 220 is specifically configured to:

divide the information bit sequence level by level in the following manner until the M segments are obtained;

determine information bits in two next-level segments of a present-level segment based on information bits in the present-level segment and an interleaving table of the present-level segment, where an encoding length corresponding to the next-level segment is half of an encoding length corresponding to the present-level segment, the interleaving table of the present-level segment is a sequence obtained by sorting polarized channels of the next-level segments in descending order or ascending order of reliability, and a total quantity of polarized channels in the interleaving table of the present-level segment is equal to the encoding length corresponding to the present-level segment; and in the M segments, separately add a corresponding cyclic redundancy check CRC code based on the information bits in each segment, to obtain the to-be-sent information of the M segments.

In one embodiment, when M is less than or equal to $N/L_1$, the processing unit 220 is further configured to:

divide the M segments level by level in the following manner until $N/L_1$ segments are obtained; and determine information bits in two next-level segments of a present-level segment based on information bits in the present-level segment and an interleaving table of the present-level segment to the next-level segments, where an encoding length corresponding to the next-level segment is half of an encoding length corresponding to the present-level segment, the interleaving table of the present-level segment is a sequence obtained by sorting polarized channels of the next-level segments in descending order or ascending order of reliability, and a total quantity of polarized channels in the interleaving table of the present-level segment is equal to the encoding length corresponding to the present-level segment, to set a value of a corresponding segment based on the basic sequence and the to-be-sent information of each segment.

In one embodiment, the processing unit 220 is specifically configured to:

alternately allocate the information bit sequence to the two next-level segments of the present-level segment in descending order of reliability based on a sequence value in the present-level interleaving table.

In one embodiment, the processing unit 220 is specifically configured to:

sequentially select locations of the polarized channels in the basic sequence in descending order based on a quantity of pieces of to-be-sent information of each of the M segments, to dispose the to-be-sent information; and add a frozen bit and a check frozen bit to each of the M segments.

In one embodiment, the obtaining unit 210 is specifically configured to:

obtain reliability of the plurality of polarized channels; and sort the sequence numbers of the plurality of polarized channels in ascending order or descending order of reliability, to generate the basic sequence.

In one embodiment, the first encoding scheme includes at least one of the following encoding schemes:

a polar code, a low density parity check (LDPC) code, a tail biting convolutional code TBCC, and a parallel concatenated convolutional Turbo code.

In one embodiment, when the first encoding scheme is the polar code encoding scheme, N is 2 raised to the power of a positive integer; or when the first encoding scheme is not the polar code encoding scheme, N is a positive integer.

It should be noted that, in some embodiments, the obtaining unit 210 may be implemented by a transceiver, and the processing unit 220 may be implemented by a processor.

Figure 10:
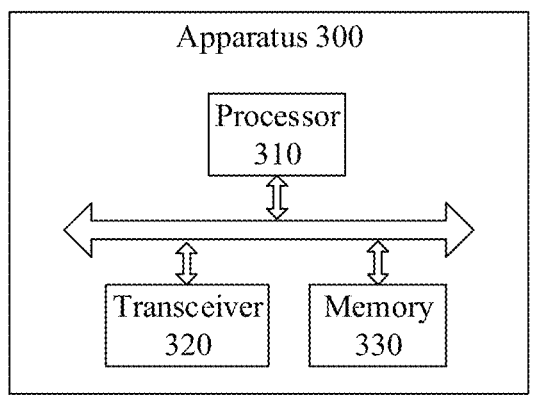
FIG. 10 is an entity structural diagram of an apparatus according to an embodiment of the present invention.

As shown in FIG. 10, an apparatus 300 may include a processor 310, a transceiver 320, and a memory 330. The memory 330 may be configured to store indication information, and may be further configured to store code, an instruction, and the like that are executed by the processor 310.

As an example rather than a limitation, a communication connection is implemented between the processor 310, the transceiver 320, and the memory 330 in a manner such as by using a bus.

It should be noted that the method performed by the processor 310 is consistent with the content of the foregoing method embodiments. Details are not described again.

It should be noted that the foregoing method embodiments may be applied to a processor or may be implemented by a processor. The processor may be an integrated circuit chip and has a signal processing capability. In an implementation process, operations in the foregoing method embodiments may be implemented by using an integrated logic circuit of hardware in the processor, or by using instructions in a form of software. The processor may be a general purpose processor, a digital signal processor (Digital Signal Processor, DSP), an application-specific integrated circuit (Application-Specific Integrated Circuit, ASIC), a field programmable gate array (Field Programmable Gate Array, FPGA) or another programmable logic device, a transistor logic device, or a discrete hardware component. The processor may implement or perform the methods, the operations, and logical block diagrams that are disclosed in the embodiments of the present invention. The general purpose processor may be a microprocessor, or the processor may be any conventional processor or the like. The operations of the methods disclosed in the embodiments of the present invention may be directly performed and completed by a hardware decoding processor, or may be performed and completed by using a combination of hardware and software modules in the decoding processor. The software module may be located in a mature storage medium in the art, such as a random access memory, a flash memory, a read-only memory, a programmable read-only memory, an electrically erasable programmable memory, or a register. The storage medium is located in a memory, and the processor reads information in the memory and completes the operations in the foregoing methods in combination with hardware of the processor.

It may be understood that the memory 330 in an embodiment of the present invention may be a volatile memory or a nonvolatile memory, or may include a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), used as an external cache. Through example but not limitative description, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM). It should be noted that the memory of the systems and methods described in this specification intends to include but is not limited to these memories and any other appropriate types of memories.

It should be understood that the terms used in the embodiments and the appended claims of the present invention are merely for the purpose of illustrating specific embodiments, and are not intended to limit the embodiments of the present invention.

For example, the term "and/or" in the embodiments of the present invention describes only an association relationship for describing associated objects and represents that three relationships may exist. Specifically, A and/or B may represent the following three cases: Only A exists, both A and B exist, and only B exists. In addition, the character "/" in this specification generally indicates an "or" relationship between the associated objects.

For another example, the terms "a", "said", and "the" of singular forms used in the embodiments and the appended claims of the present invention are also intended to include plural forms, unless otherwise specified in the context clearly.

For another example, the terms "first", "second", and "third" may be used to describe various messages, requests, and terminals in the embodiments of the present invention, but these messages, requests, and terminals are not to be limited to these terms. These terms are merely used to differentiate the messages, requests, and terminals. For example, without departing from the scope of the embodiments of the present invention, a first terminal may alternatively be referred to as a second terminal, and similarly, a second terminal may alternatively be referred to as a first terminal.

For another example, depending on the context, for example, words "if" or "as if" used herein may be explained as "while", "when", "in response to determining", or "in response to detection". Similarly, depending on the context, phrases "if determining" or "if detecting (a stated condition or event)" may be explained as "when determining" or "in response to determining" or "when detecting (the stated condition or event)" or "in response to detection (the stated condition or event)".

Persons of ordinary skill in the art may be aware that, the units and algorithm operations in the examples described with reference to the embodiments disclosed in this specification may be implemented by electronic hardware or a combination of computer software and electronic hardware. Whether the functions are performed by hardware or software depends on particular applications and design constraint conditions of the technical solutions. Persons skilled in the art may use different methods to implement the described functions for each particular application, but it should not be considered that the implementation goes beyond the scope of the embodiments of the present invention.

It may be clearly understood by persons skilled in the art that, for the purpose of convenient and brief description, for a detailed working process of the system, apparatus, and unit, reference may be made to a corresponding process in the method embodiments. Details are not described herein again.

In the several embodiments provided in the embodiments of the present invention, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the embodiments of the present invention.

In addition, functional units in the embodiments of the present invention may be integrated into one processing unit, or each of the units may exist alone physically, or two or more units are integrated into one unit.

When functions are implemented in the form of a software functional unit and sold or used as an independent product, the functions may be stored in a computer-readable storage medium. Based on such an understanding, the technical solutions in the embodiments of the present invention essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the operations of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

The foregoing content is merely specific implementations of the embodiments of the present invention, but are not intended to limit the protection scope of the embodiments of the present invention. Any variation or replacement readily figured out by a person skilled in the art within the technical scope disclosed in the present invention shall fall within the protection scope of the embodiments of the present invention. Therefore, the protection scope of the present invention shall be subject to the protection scope of the claims.

What is claimed is:

1. A polar code encoding method, comprising:
   obtaining a basic sequence, wherein the basic sequence represents a sequence of polarized channels sorted in a descending order or an ascending order according to a reliability parameter corresponding to each of the polarized channels, wherein a length of the basic sequence is $L_1$;
   determining, based on the basic sequence and an encoding length $L_2$ supported by a receiving device, M segments of an information bit sequence, wherein the information bit sequence after being encoded comprises N bits, wherein the information bit sequence before being encoded comprises K bits, wherein K is less than N, and wherein K, M, N, $L_1$, $L_2$ are positive integer values;
   separately encoding the M segments using a first encoding scheme, to obtain the M encoded segments; and
   polar encoding the M encoded segments to obtain an encoded information bit sequence that comprises the N bits.

2. The method according to claim 1, wherein the determining M segments of an information bit sequence comprises:
   determining, based on the encoding length $L_2$ supported by the receiving device, M representing a quantity of the M segments;
   obtaining to-be-sent information of each of the M segments, wherein the to-be-sent information comprises at least one information bits and at least one cyclic redundancy check (CRC) bits; and
   setting a value of a corresponding segment based on the basic sequence and the to-be-sent information of each of the M segment.

3. The method according to claim 2, wherein the obtaining to-be-sent information of the M segments of the information bit sequence comprises:
   dividing the information bit sequence level by level until the M segments are obtained by:
   determining two next-level segments of a present-level segment based on a bit rate of the present-level segment and information bits in the present-level segment, wherein an encoding length corresponding to each of the next-level segments is half of an encoding length corresponding to the present-level segment; and
   separately adding a corresponding CRC code to each of the M segments, based on the information bits in each of the M segments, to obtain the to-be-sent information of each of the M segments.

4. The method according to claim 3, wherein when M is less than or equal to $N/L_1$, the method further comprises:
   dividing the M segments level by level until the $N/L_1$ segments are obtained by:
   determining two next-level segments of a present-level segment based on a bit rate of the present-level segment and information bits in the present-level segment, wherein an encoding length corresponding to each of the next-level segments is half of an encoding length corresponding to the present-level segment; and
   setting a value of a corresponding segment based on the basic sequence and the to-be-sent information of each of the M segment.

5. The method according to claim 3, wherein before dividing the information bit sequence level by level, the method further comprises:
   obtaining a CRC code of the information bit sequence, wherein a length of the CRC code is J'; and
   calculating a bit rate R of the information bit sequence based on an encoding length N, K, and J' that are corresponding to the information bit sequence.

6. The method according to claim 2, wherein obtaining to-be-sent information of the M segments of the information bit sequence comprises:
   dividing the information bit sequence level by level until the M segments are obtained by:
   determining information bits in two next-level segments of a present-level segment based on information bits in the present-level segment and an interleaving table of the present-level segment, wherein an encoding length corresponding to each of the next-level segments is half of an encoding length corresponding to the present-level segment, the interleaving table of the present-level segment is a sequence obtained by sorting polarized channels of the next-level segments in a descending order or an ascending order of reliability according to corresponding reliability parameters, wherein a total quantity of polarized channels in the interleaving table of the present-level segment is equal to the encoding length corresponding to the present-level segment; and separately adding a corresponding CRC code to each of the M segments based on the information bits in each of the M segments, to obtain the to-be-sent information of each of the M segments.

7. The method according to claim 6, wherein when M is less than or equal to $N/L_1$, the method further comprises:

dividing the M segments level by level until $N/L_1$ segments are obtained by:

determining information bits in two next-level segments of a present-level segment based on information bits in the present-level segment and an interleaving table of the present-level segment to the next-level segments, wherein an encoding length corresponding to each of the next-level segments is half of an encoding length corresponding to the present-level segment, the interleaving table of the present-level segment is a sequence obtained by sorting polarized channels of the next-level segments in a descending order or an ascending order of reliability according to corresponding reliability parameters, wherein a total quantity of polarized channels in the interleaving table of the present-level segment is equal to the encoding length corresponding to the present-level segment; and setting a value of a corresponding segment based on the basic sequence and the to-be-sent information of each of the M segment.

8. The method according to claim 7, wherein the determining information bits in two next-level segments of a present-level segment based on information bits in the present-level segment and an interleaving table of the present-level segment to the next-level segments comprises:

alternately allocating the information bit sequence to the two next-level segments of the present-level segment in a descending order of reliability based on a sequence value in the present-level interleaving table.

9. A polar code encoding apparatus, comprising:
one or more processors; and
a non-transitory storage medium storing executable instructions, when executed by the one or more processors, causes the one or more processors to:

obtain a basic sequence, wherein the basic sequence represents a sequence of polarized channels sorted in a descending order or an ascending order according to a reliability parameter corresponding to each of the polarized channels, wherein a length of the basic sequence is $L_1$;

determine, based on the basic sequence and an encoding length $L_2$ supported by a receiving device, M segments of an information bit sequence, wherein the information bit sequence after being encoded comprises N bits, wherein the information bit sequence before being encoded comprises K bits, wherein K is less than N, and wherein K, M, N, $L_1$, $L_2$ are positive integer values;

separately encode the M segments using a first encoding scheme, to obtain M encoded segments; and perform polar code encoding on the M encoded segments to obtain an encoded information bit sequence that comprises the N bits.

10. The apparatus according to claim 9, wherein the one or more processors are further to:

determine, based on the encoding length $L_2$ supported by the receiving device, M representing a quantity of the M segments;

obtain to-be-sent information of each of the M segments, wherein the to-be-sent information comprises information bits and cyclic redundancy check (CRC) bits; and set a value of a corresponding segment based on the basic sequence and the to-be-sent information of each of the M segment.

11. The apparatus according to claim 10, wherein the one or more processors are further to:

divide the information bit sequence level by level until the M segments are obtained by:

determine two next-level segments of a present-level segment based on a bit rate of the present-level segment and information bits in the present-level segment, wherein an encoding length corresponding to each of the next-level segments is half of an encoding length corresponding to the present-level segment; and in the M segments, separately add a corresponding CRC code to each of the M segments based on the information bits in each of the M segments, to obtain the to-be-sent information of the M segments.

12. The apparatus according to claim 11, wherein when M is less than or equal to $n/L_1$, one or more processors are further to:

divide the M segments level by level until $n/L_1$ segments are obtained by:

determine two next-level segments of a present-level segment based on a bit rate of the present-level segment and information bits in the present-level segment, wherein encoding length corresponding to each of the next-level segments is half of an encoding length corresponding to the present-level segment; and set a value of a corresponding segment based on the basic sequence and the to-be-sent information of each of the M segment.

13. The apparatus according to claim 12, the one or more processors are further to:

obtain a CRC code of the information bit sequence, wherein a length of the CRC code is J'; and calculate a bit rate R of the information bit sequence based on an encoding length N, K, and J' that are corresponding to the information bit sequence.

14. The apparatus according to claim 9, wherein the one or more processors are further to:

divide the information bit sequence level by level until the M segments are obtained by:

determine information bits in two next-level segments of a present-level segment based on information bits in the present-level segment and an interleaving table of the present-level segment, wherein an encoding length corresponding to each of the next-level segments is half of an encoding length corresponding to the present-level segment, the interleaving table of the present-level segment is a sequence obtained by sorting polarized channels of the next-level segments in a descending order or an ascending order of reliability according to corresponding reliability parameters, wherein a total quantity of polarized channels in the interleaving table of the present-level segment is equal to the encoding length corresponding to the present-level segment; and separately add a corresponding CRC code to each of the M segments based on the information bits in each of the M segments, to obtain the to-be-sent information of the M segments.

15. The apparatus according to claim 14, wherein when M is less than or equal to $N/L_1$, the one or more processors are further to:
- divide the M segments level by level until $N/L_1$ segments are obtained by:
- determine information bits in two next-level segments of a present-level segment based on information bits in the present-level segment and an interleaving table of the present-level segment to the next-level segments, wherein an encoding length corresponding to each of the next-level segments is half of an encoding length corresponding to the present-level segment, the interleaving table of the present-level segment is a sequence obtained by sorting polarized channels of the next-level segments in a descending order or an ascending order of reliability according to corresponding reliability parameters, wherein a total quantity of polarized channels in the interleaving table of the present-level segment is equal to the encoding length corresponding to the present-level segment; and
- set a value of a corresponding segment based on the basic sequence and the to-be-sent information of each of the M segment.

16. The apparatus according to claim_15, wherein the one or more processors are further to:
- alternately allocate the information bit sequence to the two next-level segments of the present-level segment in a descending order of reliability based on a sequence value in the present-level interleaving table.

17. A non-transitory computer-readable storage medium having instructions stored therein, which when executed by a processor, cause the processor to perform operations, the operations comprising:
- obtaining a basic sequence, wherein the basic sequence represents a sequence of polarized channels sorted in a descending order or an ascending order according to a reliability parameter corresponding to each of the polarized channels, and a length of the basic sequence is $L_1$;
- determining, based on the basic sequence and an encoding length $L_2$ supported by a receiving device, M segments of an information bit sequence, wherein the information bit sequence after being encoded comprises N bits, wherein the information bit sequence before being encoded comprises K bits, wherein K is less than N, and wherein K, M, N, $L_1$, $L_2$ are positive integer values;
- separately encoding the M segments using a first encoding scheme, to obtain M encoded segments; and
- polar encoding on the M encoded segments to obtain an encoded information bit sequence that comprises the N bits.

18. The non-transitory computer-readable storage medium according to claim 17, wherein the determining M segments of an information bit sequence comprises:
- determining, based on the encoding length $L_2$ supported by the receiving device, M representing a quantity of the M segments;
- obtaining to-be-sent information of each of the M segments, wherein the to-be-sent information comprises at least one information bits and at least one cyclic redundancy check (CRC) bits; and
- setting a value of a corresponding segment based on the basic sequence and the to-be-sent information of each of the M segment.

19. The non-transitory computer-readable storage medium according to claim 18, wherein obtaining to-be-sent information of the M segments of the information bit sequence comprises:
- dividing the information bit sequence level by level until the M segments are obtained;
- determining two next-level segments of a present-level segment based on a bit rate of the present-level segment and information bits in the present-level segment, wherein a code length corresponding to each of the next-level segments is half of a code length corresponding to the present-level segment; and
- separately adding a corresponding CRC code to each of the M segments based on the information bits in each of the M segments, to obtain the to-be-sent information of each of the M segments.

20. The non-transitory computer-readable storage medium according to claim 19, wherein when M is less than or equal to $N/L_1$, the operations further comprise:
- dividing the M segments level by level until $N/L_1$ segments are obtained; and
- determining two next-level segments of a present-level segment based on a bit rate of the present-level segment and information bits in the present-level segment, wherein a code length corresponding to each of the next-level segments is half of a code length corresponding to the present-level segment; and
- set a value of a corresponding segment based on the basic sequence and the to-be-sent information of each of the M segment.

* * * * *